(12) United States Patent
Takahata et al.

(10) Patent No.: US 7,906,213 B2
(45) Date of Patent: *Mar. 15, 2011

(54) EPOXY RESIN CURABLE COMPOSITION FOR PREPREG

(75) Inventors: Yoshinori Takahata, Tokyo (JP); Takahiro Mori, Tokyo (JP); Seiichi Saito, Tokyo (JP); Mitsunori Ide, Tokyo (JP); Yoshihiro Fukuda, Tokyo (JP)

(73) Assignee: Adeka Corporation, Tokyo (JP)

( * ) Notice: Subject to any disclaimer, the term of this patent is extended or adjusted under 35 U.S.C. 154(b) by 237 days.

This patent is subject to a terminal disclaimer.

(21) Appl. No.: 12/278,176

(22) PCT Filed: Feb. 8, 2007

(86) PCT No.: PCT/JP2007/052173
§ 371 (c)(1),
(2), (4) Date: Aug. 4, 2008

(87) PCT Pub. No.: WO2007/108242
PCT Pub. Date: Sep. 27, 2007

(65) Prior Publication Data
US 2009/0030147 A1    Jan. 29, 2009

(30) Foreign Application Priority Data
Mar. 15, 2006 (JP) .................. 2006-071417

(51) Int. Cl.
*B32B 15/092* (2006.01)
*B32B 15/088* (2006.01)
*B32B 27/04* (2006.01)
*B32B 27/34* (2006.01)
*B32B 27/38* (2006.01)
*C08L 63/00* (2006.01)

(52) U.S. Cl. .................. 428/416; 428/297.4; 428/413; 428/414; 428/474.4; 428/901; 525/533

(58) Field of Classification Search .................. None
See application file for complete search history.

(56) References Cited

U.S. PATENT DOCUMENTS

| 2,915,484 A | 12/1959 | Kohler et al. |
| 2010/0112323 A1* | 5/2010 | Mori et al. .................. 428/220 |

FOREIGN PATENT DOCUMENTS

| DE | 1 099 733 | 2/1961 |
| JP | 2001-31784 | 2/2001 |
| JP | 2001-49082 | 2/2001 |
| JP | 2001-146546 | 5/2001 |
| JP | 2002-256137 | 9/2002 |
| JP | 2005-29720 | 2/2005 |
| WO | WO 2006/129480 A1 * | 12/2006 |

OTHER PUBLICATIONS

Abstract of WO 2006/129480 A1 (no date).*
Machine translation of KR 10-2008-0025089, provided by the KIPO website (no date).*
Machine translation of JP 2001-146546, provided by the JPO website (no date).*
Machine translation of JP 2002-256137, provided by the JPO website (no date).*

* cited by examiner

*Primary Examiner* — Michael J Feely
(74) *Attorney, Agent, or Firm* — Young & Thompson

(57) ABSTRACT

An epoxy resin curable composition for a prepreg, comprising the following components (A) to (E): (A) a polyamide compound having a structure derived from an aromatic diamine including a phenolic hydroxyl group, the aromatic diamine having the phenolic hydroxyl group in a position adjacent to an amino group; (B) an epoxy resin; (C) an epoxy resin curing agent; (D) a filler; and (E) a solvent.

3 Claims, No Drawings

EPOXY RESIN CURABLE COMPOSITION FOR PREPREG

TECHNICAL FIELD

The present invention relates to an epoxy resin curable composition for a prepreg including a polyamide compound having a phenolic hydroxyl group in a specific position in the structure of the compound, and specifically relates to an epoxy resin curable composition for a prepreg, from which a prepreg having a low linear thermal expansion coefficient as well as a printed wiring board can be obtained by employing the polyamide compound as a curing-agent component.

BACKGROUND ART

Epoxy resins are widely used for printed wiring boards due to their properties. The use of epoxy resins is also being considered for complying with, the increase in board density associated with the recent years' reduction in size and weight.

Particularly, epoxy resins used for prepregs etc. include a large amount of various inorganic fillers to reduce linear thermal expansion and thereby suppress thermal deformation. However, adding a large amount of inorganic filler may reduce tensile strength and extension or may cause short-circuiting due to cohesion and impair circuit reliability, thereby making prepreg preparation difficult.

Patent Document 1 (listed below) discloses, as an epoxy resin, a cured product obtained from 2,2-bis(3,4-epoxycyclohexyl)propane and an acid anhydride. Further, Patent Documents 2 to 4 each discloses an epoxy resin including a polyamide having a phenolic hydroxyl group.

Patent Documents 2 to 4, however, fail to specifically disclose the compound of the present invention derived from a hydroxylated aromatic diamine having a phenolic hydroxyl group in a position adjacent to an amino group as a compound having particularly superior characteristics, nor do the documents disclose the fact that the compound exhibits unique effects in glass transition temperature and linear thermal expansion coefficient.

Patent Document 1: Specification of German Patent No. 1 099 733
Patent Document 2: Claims and Examples on page 6 line 40 of left column to end of page 8 of Japanese Patent Laid Open JP-A-2001-31784
Patent Document 3: Claims of Japanese Patent Laid Open JP-A-2001-49082
Patent Document 4: Claims of Japanese Patent Laid Open JP-A-2005-29720

DISCLOSURE OF THE INVENTION

Problems to be Solved by Invention

Accordingly, an object of the present invention is to provide an epoxy resin curable composition for a prepreg, from which a prepreg having a high glass transition temperature and a low linear thermal expansion coefficient can be obtained.

Means for Solving Problems

Inventors have diligently made researches in view of the above-described current circumstances, and have found that the use of a polyamide compound that has a structure derived from a hydroxylated aromatic diamine having a phenolic hydroxyl group in a position adjacent to an amino group obtains an epoxy resin curable composition from which a prepreg having a high glass transition temperature and a low linear thermal expansion coefficient can be obtained, thus arriving at the present invention.

That is, the present invention provides an epoxy resin curable composition for a prepreg, the composition including the following components (A) to (E):

(A): a polyamide compound having a structure derived from an aromatic diamine including a phenolic hydroxyl group, the aromatic diamine having the phenolic hydroxyl group in a position adjacent to an amino group;

(B): an epoxy resin;

(C): an epoxy resin curing agent;

(D): a filler; and (E): a solvent.

The present invention provides the epoxy resin curable composition for a prepreg, wherein the polyamide compound of the component (A) has, in a repeating unit thereof, a structure having a phenolic hydroxyl group and represented by the following general formula (I) or (II);

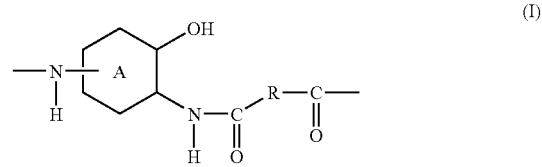

wherein, the ring A represents an arylene group having 6 to 18 carbon atoms or an alkylidene-diarylene group having 13 to 25 carbon atoms; the arylene or alkylidene-diarylene group may be substituted by a halogen atom, a hydroxyl group, or an alkyl group having 1 to 4 carbon atoms; R represents an alkylene group having 2 to 10 carbon atoms, a cycloalkylene having 6 to 18 carbon atoms, an arylene group, or an alkylidene-diarylene group having 13 to 25 carbon atoms; and the alkylene, cycloalkylene, arylene, or alkylidene-diarylene group may be substituted by a halogen atom, a hydroxyl group, or an alkyl group having 1 to 4 carbon atoms;

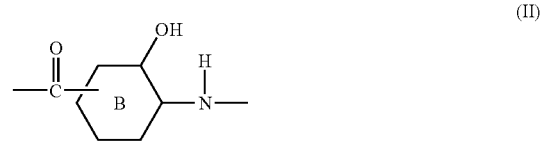

wherein, the ring B represents an arylene group having 6 to 18 carbon atoms or an alkylidene-diarylene group having 13 to 25 carbon atoms; and the arylene or alkylidene-diarylene group may be substituted by a halogen atom, a hydroxyl group, or an alkyl group having 1 to 4 carbon atoms.

The present invention provides the epoxy resin curable composition for a prepreg, wherein the polyamide compound of the component (A) is of a structure having a phenolic hydroxyl group and represented by the following general formula (III) or (IV);

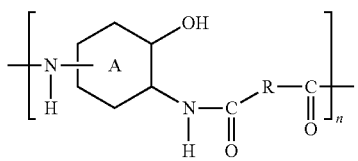

(III)

wherein, the ring A represents an arylene group having 6 to 18 carbon atoms or an alkylidene-diarylene group having 13 to 25 carbon atoms; the arylene or alkylidene-diarylene group may be substituted by a halogen atom, a hydroxyl group, or an alkyl group having 1 to 4 carbon atoms; R represents an alkylene group having 2 to 10 carbon atoms, a cycloalkylene group having 6 to 18 carbon atoms, an arylene group, or an alkylidene-diarylene group having 13 to 25 carbon atoms; the alkylene, cycloalkylene, arylene, or alkylidene-diarylene group may be substituted by a halogen atom, a hydroxyl group, or an alkyl group having 1 to 4 carbon atoms; and n is a positive number;

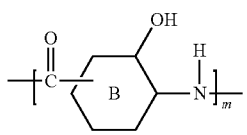

(IV)

wherein, the ring B represents an arylene group having 6 to 18 carbon atoms or an alkylidene-diarylene group having 13 to 25 carbon atoms; the arylene or alkylidene-diarylene group may be substituted by a halogen atom, a hydroxyl group, or an alkyl group having 1 to 4 carbon atoms; and m is a positive number.

The present invention provides a prepreg obtained from the epoxy resin curable composition for a prepreg.

The present invention provides a printed wiring board obtained from the prepreg.

BEST MODE FOR CARRYING OUT THE INVENTION

The present invention is described in detail below.

First, the component (A) of the invention is described.

The component (A) of the invention is a polyamide compound that has a structure derived from a phenolic-hydroxyl-group—including aromatic diamine having a phenolic hydroxyl group in a position adjacent to an amino group. The "phenolic-hydroxyl-group—including aromatic diamine having a phenolic hydroxyl group in a position adjacent to an amino group" as used in the present invention includes salts thereof. That is, the present polyamide has a structure derived either from a phenolic-hydroxyl-group—including aromatic diamine having a phenolic hydroxyl group in a position adjacent to an amino group, or a salt thereof.

Further, the present polyamide compound is a polyamide compound made by being derived from: a phenolic-hydroxyl-group—including aromatic diamine (or a salt thereof) having a phenolic hydroxyl group in a position adjacent to an amino group; and a dicarboxylic acid (various aromatic dicarboxylic acids or aliphatic dicarboxylic acids, or an acid chloride, an ester, etc. thereof). The number of phenolic hydroxyl groups located adjacent to the amino group is not particularly limited, and for example, 1 to 4 hydroxyl groups may be included in a single molecule of aromatic diamine.

Needless to say, the present polyamide compound may also be derived from a diamine compound (such as various aromatic diamines or aliphatic diamines, or a salt thereof) other than a diamine having a phenolic hydroxyl group in a position adjacent to an amino group—which polyamide compound may constitute a further constituent component—, and a dicarboxylic acid (or an acid chloride, an ester, etc. thereof) including a phenolic hydroxyl group may also be used.

Examples of a phenolic-hydroxyl-group—including aromatic diamine having a phenolic hydroxyl group in a position adjacent to an amino group include, but are not particularly limited to, compounds having 1 to 4 hydroxyl groups bonded to a position adjacent to the amino group of such aromatic diamines as the following: m-phenylenediamine, p-phenylenediamine, m-tolylenediamine, 4,4'-diaminodiphenyl ether, 3,3'-dimethyl-4,4'-diaminodiphenyl ether, 3,4'-diaminodiphenyl ether, 4,4'-diaminodiphenyl thioether, 3,3'-dimethyl-4,4'-diaminodiphenyl thioether, 3,3'-diethoxy-4,4'-diaminodiphenyl thioether, 3,3'-diaminodiphenyl thioether, 4,4'-diaminobenzophenone, 3,3'-dimethyl-4,4'-diaminobenzophenone, 3,3'-diaminodiphenylmethane, 4,4'-diaminodiphenylmethane; 3,4'-diaminodiphenylmethane, 3,3'-dimethoxy-4,4'-diaminodiphenyl thioether, 2,2'-bis(3-aminophenyl)propane, 2,2'-bis(4-aminophenyl)propane, 4,4'-diaminodiphenyl sulfoxide, 4,4'-diaminodiphenyl sulfone, benzidine, 3,3'-dimethylbenzidine, 3,3'-dimethoxybenzidine, 3,3'-diaminobiphenyl p-xylylenediamine, m-xylylenediamine, o-xylylenediamine, 2,2'-bis(3-aminophenoxyphenyl)propane, 2,2'-bis(4-aminophenoxyphenyl)propane, 1,3-bis(4-aminophenoxyphenyl)benzene, 1,3'-bis(3-aminophenoxyphenyl)propane, bis(4-amino-3-methylphenyl)methane, bis(4-amino-3,5-dimethylphenyl)methane, bis(4-amino-3-ethylphenyl)methane, bis(4-amino-3,5-diethylphenyl)methane, bis(4-amino-3-propylphenyl)methane, bis(4-amino-3,5-dipropylphenyl)methane, 2,2'-bis(3-aminophenyl)hexafluoropropane, and 2,2'-bis(4-aminophenyl)hexafluoropropane. The compounds, however, are not limited to the above. A single type, or two or more types, of the above compounds may be used as a mixture. The above compound may be used in combination with an aromatic diamine having no hydroxyl group bonded thereto. A salt of one of the above-described diamines may be given as an example of a salt of the present phenolic-hydroxyl-group—including aromatic diamine having a phenolic hydroxyl group in a position adjacent to an amino group. The above also provides examples of an aromatic diamine having no hydroxyl group bonded thereto (or a salt thereof).

Examples of a dicarboxylic acid that reacts with the phenolic-hydroxyl-group—including aromatic diamine having a phenolic hydroxyl group in a position adjacent to an amino group to thus constitute the present polyamide compound include, but are not particularly limited to, the following: phthalic acid, isophthalic acid, terephthalic acid, 4,4'-oxydibenzoic acid, 4,4'-biphenyldicarboxylic acid, 3,3'-methylene dibenzoic acid, 4,4'-methylene dibenzoic acid, 4,4'-thiodibenzoic acid, 3,3'-carbonyldibenzoic acid, 4,4'-carbonyldibenzoic acid, 4,4'-sulfonyldibenzoic acid, 1,5-naphthalene dicarboxylic acid, 1,4-naphthalene dicarboxylic acid, 2,6-naphthalene dicarboxylic acid, 1,2-naphthalene dicarboxylic acid, 5-hydroxyisophthalic acid, 4-hydroxyisophthalic acid, 2-hydroxyisophthalic acid, 3-hydroxyisophthalic acid, 2-hydroxyterephthalic acid, 2,2'-bis(3-carboxyphenyl)hexafluoropropane, and 2,2'-bis(4-carboxyphenyl)hexafluoropropane. A single type, or two or more types, of the above compounds may be used as a mixture. An acid chloride or an ester of one of the above-described dicarboxylic acids may be given as an example of an acid chloride or an ester of the present dicarboxylic acid.

A feature of a preferred structure of the polyamide compound of the component (A) of the present invention is that the compound has, in its repeating unit, a structure represented by the following general formula (I) or (II), and the structure has a phenolic hydroxyl group in a position adjacent to an amino group thereof.

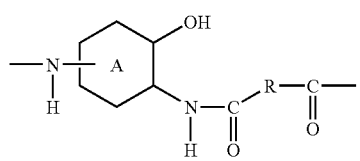
(I)

wherein, the ring A represents an arylene group having 6 to 18 carbon atoms or an alkylidene-diarylene group having 13 to 25 carbon atoms; the arylene or alkylidene-diarylene group may be substituted by a halogen atom, a hydroxyl group, or an alkyl group having 1 to 4 carbon atoms; R represents an alkylene group having 2 to 10 carbon atoms, a cycloalkylene having 6 to 18 carbon atoms, an arylene group, or an alkylidene-diarylene group having 13 to 25 carbon atoms; and the alkylene, cycloalkylene, arylene, or alkylidene-diarylene group may be substituted by a halogen atom, a hydroxyl group, or an alkyl group having 1 to 4 carbon atoms;

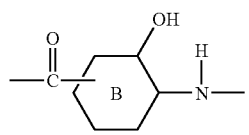
(II)

wherein, the ring B represents an arylene group having 6 to 18 carbon atoms or an alkylidene-diarylene group having 13 to 25 carbon atoms; and the arylene or alkylidene-diarylene group may be substituted by a halogen atom, a hydroxyl group, or an alkyl group having 1 to 4 carbon atoms.

Examples of the arylene group having 6 to 18 carbon atoms represented by the ring A in the general formula (I) or the ring B in the general formula (II) include: a 1,2-phenylene group, a 1,3-phenylene group, a 1,4-phenylene group, a 1,5-naphthylene group, a 2,5-naphthylene group, anthracene-diyl, a 4,4'-biphenylene group, a 4,4'-p-terphenylene group, a 4,4'-m-terphenylene group, a 2-fluoro-1,4-phenylene group, and a 2,5-dimethyl-1,4-phenylene group.

Examples of the alkylidene-diarylene group having 13 to 25 carbon atoms represented by the ring A in the general formula (I) or the ring B in the general formula (II) include: a methylidene-diphenylene group, an ethylidene-diphenylene group, a propylidene-diphenylene group, an isopropylidene-diphenylene group, a hexafluoroisopropylidene-diphenylene group, a propylidene-3,3',5,5'-tetrafluoro-diphenylene group, and a fluorene-9-ylidene-diphenylene group.

Examples of the alkylene group having 2 to 10 carbon atoms represented by R in the general formula (I) include: ethylene, propylene, trimethylene, tetramethylene, 2,2-dimethyltrimethylene, hexamethylene, octamethylene, and decamethylene.

Examples of the cycloalkylene group having 6 to 18 carbon atoms represented by R in the general formula (I) include bivalence groups such as: cyclohexene, cycloheptene, cyclooctene, bicyclohexene, and dicyclohexene.

Examples of the arylene group represented by R in the general formula (I) include the same groups as those of the ring A.

Examples of the alkylidene-diarylene group represented by R in the general formula (I) include the same groups as those of the ring A.

Further, a preferred structure of the polyamide compound of the component (A) of the invention includes a compound having a structure of the following general formula (III) or (IV), which includes, in its repeating unit, only the structure represented by the above-described general formula (I) or (II).

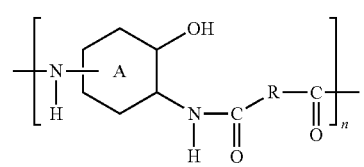
(III)

wherein, the ring A represents an arylene group having 6 to 18 carbon atoms or an alkylidene-diarylene group having 13 to 25 carbon atoms; the arylene or alkylidene-diarylene group may be substituted by a halogen atom, a hydroxyl group, or an alkyl group having 1 to 4 carbon atoms; R represents an alkylene group having 2 to 10 carbon atoms, a cycloalkylene group having 6 to 18 carbon atoms, an arylene group, or an alkylidene-diarylene group having 13 to 25 carbon atoms; the alkylene, cycloalkylene, arylene, or alkylidene-diarylene group may be substituted by a halogen atom, a hydroxyl group, or an alkyl group having 1 to 4 carbon atoms; and n is a positive number;

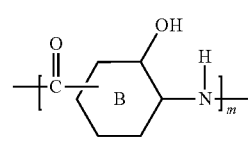
(IV)

wherein, the ring B represents an arylene group having 6 to 18 carbon atoms or an alkylidene-diarylene group having 13 to 25 carbon atoms; the arylene or alkylidene-diarylene group may be substituted by a halogen atom, a hydroxyl group, or an alkyl group having 1 to 4 carbon atoms; and m is a positive number.

Examples of the arylene group represented by the ring A in the general formula (III) include the same groups as those in the general formula (I).

Examples of the alkylidene-diarylene group represented by the ring A in the general formula (III) include the same groups as those in the general formula (I).

Examples of the alkylene group having 2 to 10 carbon atoms represented by R in the general formula (III) include the same groups as those in the general formula (I).

Examples of the cycloalkylene group having 6 to 18 carbon atoms represented by R in the general formula (III) include the same groups as those in the general formula (I).

Examples of the arylene group represented by R in the general formula (III) include the same groups as those in the general formula (I).

Examples of the alkylidene-diarylene group represented by R in the general formula (III) include the same groups as those in the general formula (I).

Examples of the arylene group represented by the ring B in the general formula (IV) include the same groups as those in the general formula (II).

Examples of the alkylidene-diarylene group represented by the ring B in the general formula (IV) include the same groups as those in the general formula (II).

For example, the following structures Nos. 1 to 20 may be given as examples of preferred, more specific structures of the polyamide compound of the component (A) of the invention. The present invention, however, is not limited in any way by the following structures.

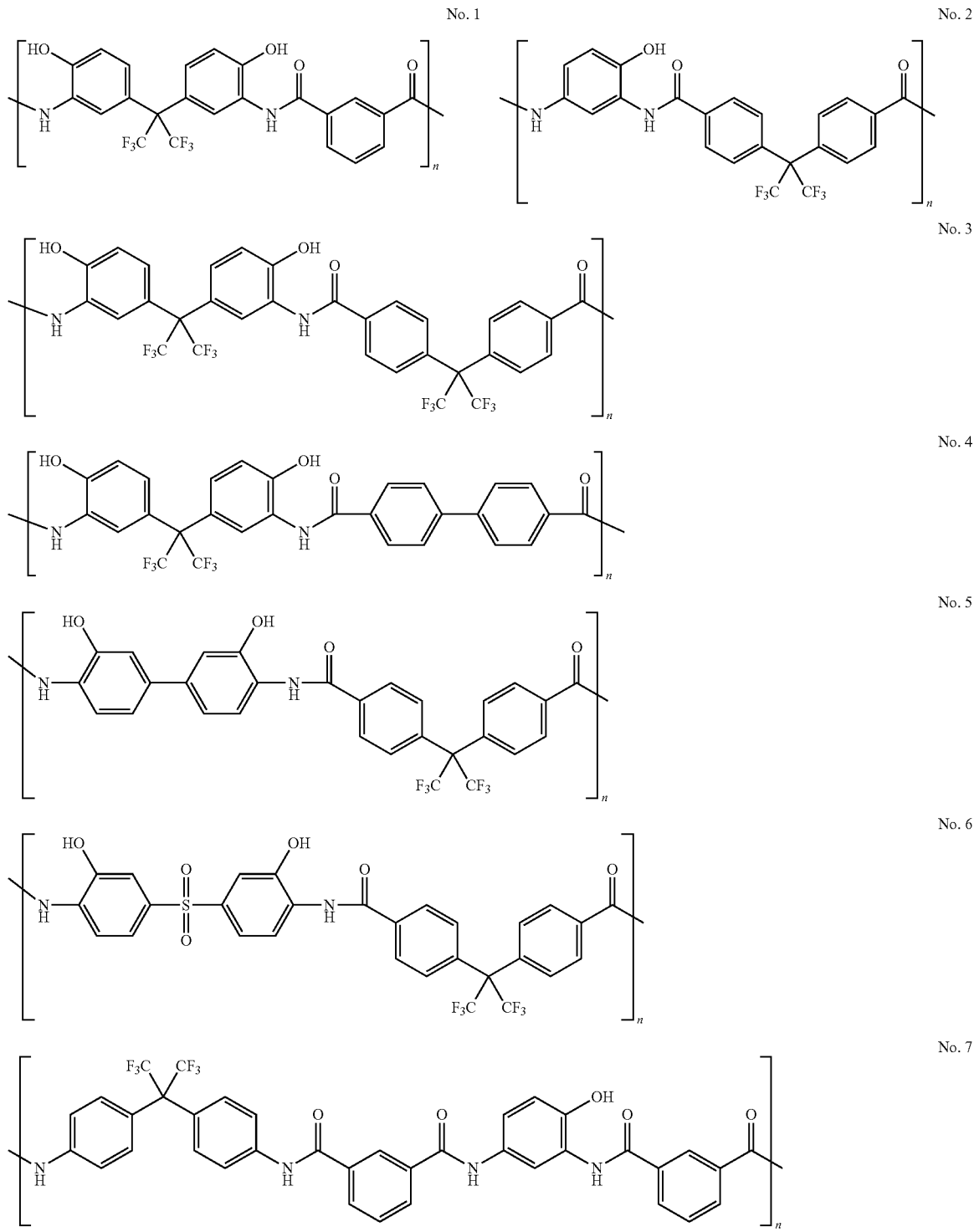

-continued
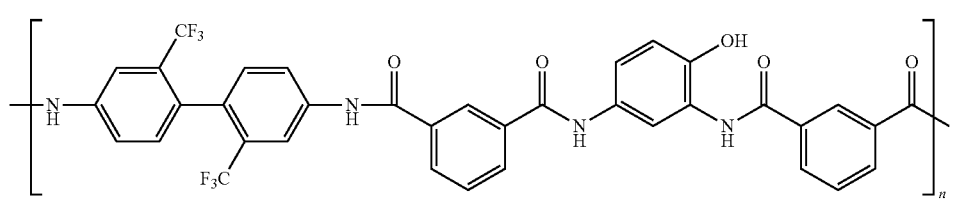
No. 8
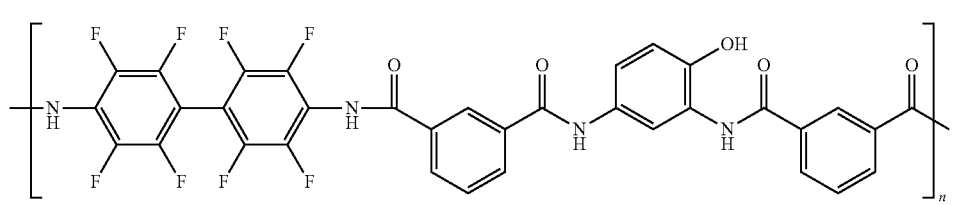
No. 9
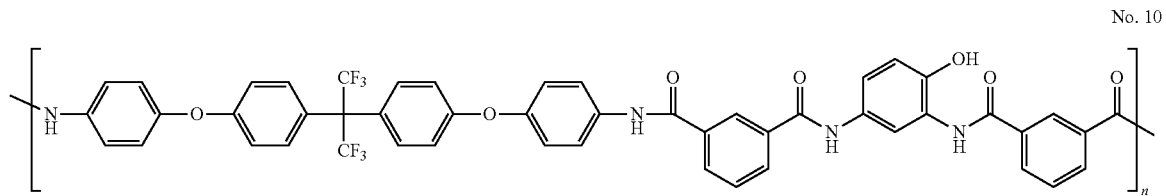
No. 10
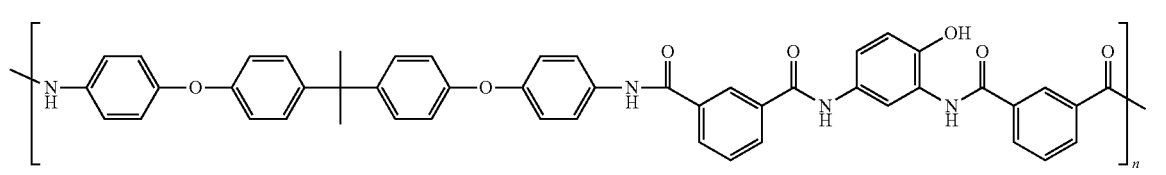
No. 11
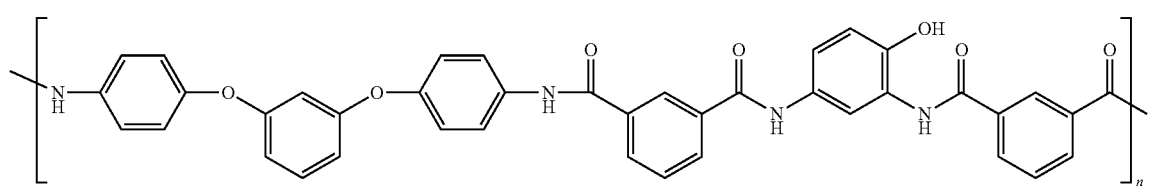
No. 12
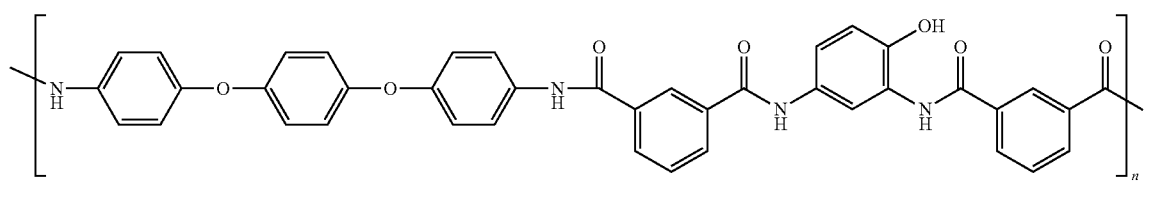
No. 13
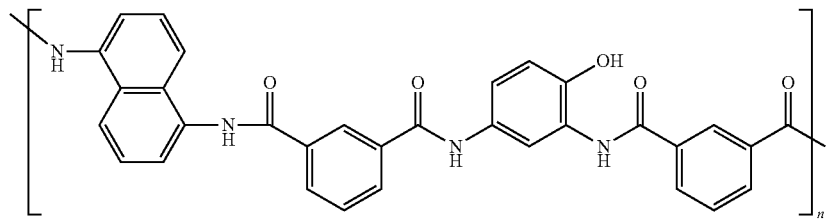
No. 14

No. 15
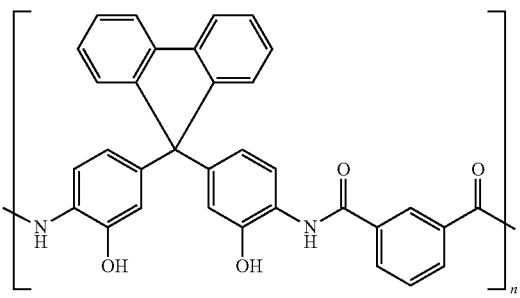
No. 16
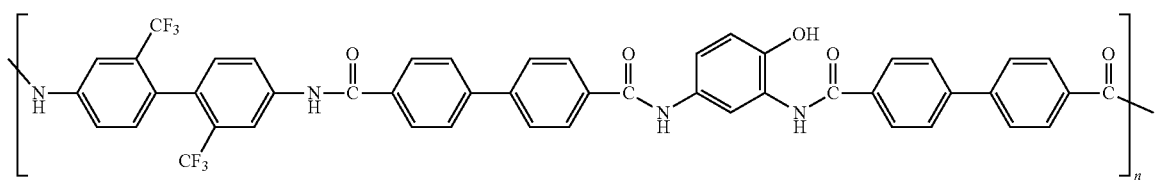
No. 17
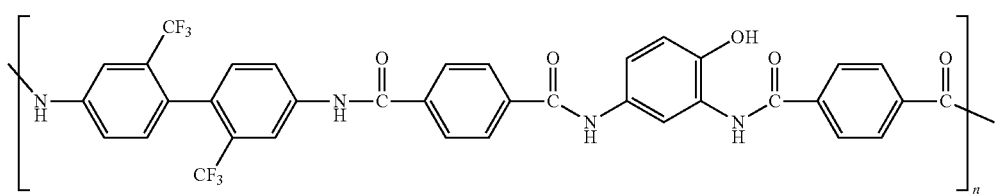
No. 18
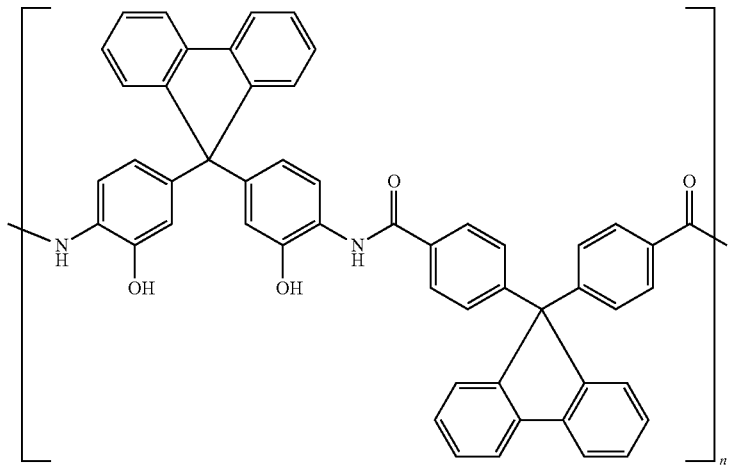
No. 19
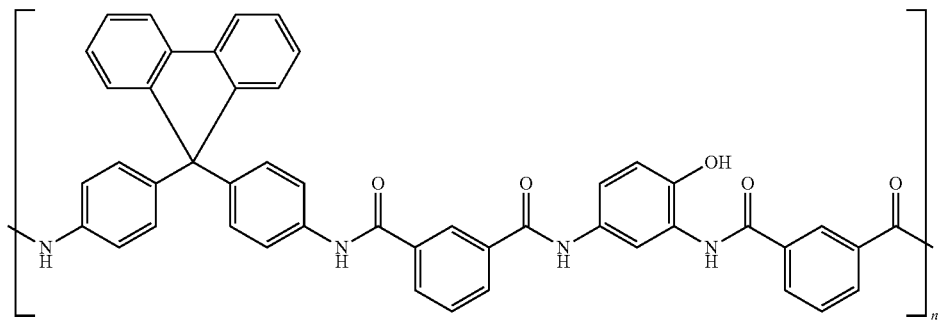

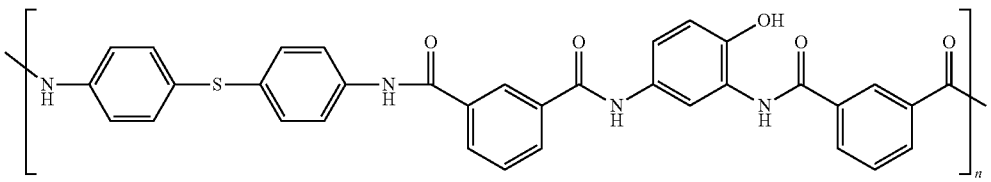

No. 20

From the viewpoint of the properties of the cured product, the content of the polyamide compound of the component (A) with respect to the epoxy resin curable composition for a prepreg according to this invention is preferably 1% to 98% by mass, and more preferably 1% to 90% by mass.

Next, the epoxy resin, which is the component (B) of the present invention, is described.

The epoxy resin of the component (B) is not particularly limited, and it is possible to use, for example, known aromatic epoxy compounds, alicyclic epoxy compounds, and aliphatic epoxy compounds. Examples of aromatic epoxy compounds include glycidyl ether compounds of polyphenols, such as hydroquinone, resorcinol, bisphenol A, bisphenol F, 4,4'-dihydroxybiphenyl, novolac, tetrabromobisphenol A, 2,2-bis(4-hydroxyphenyl)-1,1,1,3,3,3-hexafluoropropane, and 1,6-dihydroxynaphthalene. Examples of alicyclic epoxy compounds include polyglycidyl ethers of polyols having at least one alicyclic ring, or compounds including cyclohexene oxide or cyclopentene oxide obtained by epoxidizing compounds including a cyclohexene ring or cyclopentene ring with an oxidizer. Examples thereof include: hydrogenated bisphenol A diglycidyl ether, 3,4-epoxycyclohexylmethyl-3,4-epoxycyclohexyl carboxylate, 3,4-epoxy-1-methylcyclohexyl-3,4-epoxy-1-methylhexane carboxylate, 6-methyl-3,4-epoxycyclohexylmethyl-6-methyl-3,4-epoxycyclohexane carboxylate, 3,4-epoxy-3-methylcyclohexylmethyl-3,4-epoxy-3-methylcyclohexane carboxylate, 3,4-epoxy-5-methylcyclohexylmethyl-3,4-epoxy-5-methylcyclohexane carboxylate, bis(3,4-epoxycyclohexylmethyl)adipate, methylene-bis(3,4-epoxycyclohexane), 2,2-bis(3,4-epoxycyclohexyl)propane, dicyclopentadiene diepoxide, ethylene-bis(3,4-epoxycyclohexane carboxylate), dioctyl epoxyhexahydrophthalate, and di-2-ethylhexyl epoxyhexahydrophthalate. Examples of aliphatic epoxy compounds include polyglycidyl ethers of aliphatic polyols or alkylene-oxide adducts thereof, polyglycidyl esters of aliphatic long-chain polybasic acids, homopolymers synthesized by vinyl-polymerizing glycidyl acrylate or glycidyl methacrylate, and copolymers synthesized by vinyl-polymerizing glycidyl acrylate or glycidyl methacrylate and other vinyl monomers. Examples of representative compounds thereof include: glycidyl ethers of polyols, such as 1,4-butanediol diglycidyl ether, 1,6-hexanediol diglycidyl ether, a triglycidyl ether of glycerin, a triglycidyl ether of trimethylol propane, a tetraglycidyl ether of sorbitol, a hexaglycidyl ether of dipentaerythritol, a diglycidyl ether of polyethylene glycol, and a diglycidyl ether of polypropylene glycol; polyglycidyl ethers of polyether polyols obtained by adding one type, or two or more types, of alkylene oxide to aliphatic polyols such as propylene glycol, trimethylol propane, and glycerin; and diglycidyl esters of aliphatic long-chain dibasic acids. Other examples include: monoglycidyl ethers of higher aliphatic alcohols; monoglycidyl ethers of phenol, cresol, or butylphenol, or a polyether alcohol obtained by adding an alkylene oxide thereto; glycidyl esters of higher fatty acids; epoxidized soybean oil; octyl epoxystearate; butyl epoxystearate; and epoxidized polybutadiene.

From the viewpoint of the properties of the cured product, the content of the epoxy resin of the component (B) with respect to the epoxy resin curable composition for a prepreg according to this invention is preferably 1% to 90% by mass, and more preferably 1% to 50% by mass.

Next, the epoxy resin curing agent, which is the component (C) of the present invention, is described.

Examples of the epoxy resin curing agent of the component (C) include latent curing agents, polyamine compounds, polyphenol compounds, and cationic photoinitiators, and also include so-called curing accelerators.

Examples of latent curing agents include dicyandiamide, hydrazide, imidazole compounds, amine adducts, sulfonium salts, onium salts, ketimines, acid anhydrides, and tertiary amines. These latent curing agents are preferable in terms that they provide one-component curable compositions and are thus easy to handle.

Examples of acid anhydrides include phthalic anhydride, trimellitic anhydride, pyromellitic anhydride, tetrahydrophthalic anhydride, hexahydrophthalic anhydride, maleic anhydride, succinic anhydride, and 2,2-bis(3,4-dicarboxyphenyl)-1,1,1,3,3,3-hexafluoropropane dianhydride.

Examples of polyamine compounds include: aliphatic polyamines such as ethylenediamine, diethylenetriamine, and triethylenetetramine; alicyclic polyamines such as menthane diamine, isophorone diamine, bis(4-amino-3-methylcyclohexyl)methane, bis(aminomethyl)cyclohexane, and 3,9-bis(3-aminopropyl)2,4,8,10-tetraoxaspiro[5,5]undecane; aliphatic amines including an aromatic ring such as m-xylenediamine; and aromatic polyamines such as m-phenylenediamine, 2,2-bis(4-aminophenyl)propane, diaminodiphenylmethane, diaminodiphenylsulfone, α,α-bis(4-aminophenyl)-p-diisopropylbenzene, and 2,2-bis(4-aminophenyl)-1,1,1,3,3,3-hexafluoropropane.

Examples of polyphenol compounds include: phenol novolac, o-cresol novolac, t-butylphenol novolac, dicyclopentadiene cresol, terpene diphenol, terpene dicatechol, 1,1,3-tris(3-tert-butyl-4-hydroxy-6-methylphenyl)butane, butylidene bis(3-tert-butyl-4-hydroxy-6-methylphenyl), and 2,2-bis(4-hydroxyphenyl)-1,1,1,3,3,3-hexafluoropropane.

Phenol novolac is preferable because the electric properties and mechanical strength of the obtained epoxy resin are suitable for a laminate.

Examples of imidazole compounds include: various imidazoles such as 2-methylimidazole, 2-phenylimidazole, 2-undecylimidazole, 2-heptadecylimidazole, 2-phenyl-4-methylimidazole, 1-benzyl-2-phenylimidazole, 1-benzyl-2-methylimidazole, 1-cyanoethyl-2-methylimidazole, 1-cyanoethyl-2-phenylimidazole, 1-cyanoethyl-2-undecylimidazole, 2,4-diamino-6(2'-methylimidazole (1')) ethyl-s-triazine, 2,4-diamino-6(2'-undecylimidazole (1')) ethyl-s-triazine, 2,4-diamino-6(2'-ethyl, 4-methylimidazole (1'))ethyl-s-triazine, 2,4-diamino-6(2'-methylimidazole (1')) ethyl-s-triazine/isocyanuric acid adduct, 2:3 adduct of 2-methylimidazole/isocyanuric acid, 2-phenylimidazole/isocyanuric acid adduct, 2-phenyl-3,5-dihydroxymethylimidazole, 2-phenyl-4-hydroxymethyl-5-methylimidazole, and 1-cyanoethyl-2-phenyl-3,5-dicyanoethoxymethylimidazole; and salts of these imidazoles and polycarboxylic acids such as phthalic acid, isophthalic acid, terephthalic acid, trimellitic acid, pyromellitic acid, naphthalene dicarboxylic acid, maleic acid, and oxalic acid.

The cationic photoinitiator that may be used in the present invention is a compound capable of releasing a substance for initiating cationic polymerization by irradiation of an energy ray, and particularly preferred compounds are double salts, or derivatives thereof, that are onium salts releasing a Lewis acid as a result of the irradiation. An example of a typical compound includes a salt of a cation and an anion represented by the following general formula:

$$[A]^{m+}[B]^{m-}$$

The cation $[A]^{m+}$ is preferably an onium, and its structure, for example, can be represented by the following general formula:

$$[(R^1)_a Q]^{m+}$$

$R^1$ is an organic group having 1 to 60 carbon atoms and including as many atoms, other than carbon atoms, as necessary, "a" is an integer of 1 to 5. The "a" units of $R^1$ are independent, and may be the same or be different from one another. Preferably, at least one of the "a" units of $R^1$ is an organic group having an aromatic ring, such as the one described above. "Q" is an atom or an atom group selected from the group consisting of S, N, Se, Te, P, As, Sb, Bi, O, I, Br, Cl, F, and N=N. When the valence of "Q" in the cation $[A]^{m+}$ is "q", the relationship m=a−q needs to be fulfilled. (Here, N=N is considered as having a valence of zero.)

The anion $[B]^{m-}$ is preferably a halogenated complex, and an example of its structure can be represented by the following general formula:

$$[LX_b]^{m-}$$

"L" is a metal or metalloid constituting the central atom of the halogenated complex, and is, for example, B, P, As, Sb, Fe, Sn, Bi, Al, Ca, In, Ti, Zn, Sc, V, Cr, Mn, or Co. "X" is a halogen atom, "b" is an integer of 3 to 7.

When the valence of "L" in the anion $[B]^{m-}$ is "p", the relationship m=b−p needs to be fulfilled.

Specific examples of the anion $[LX_b]^{m-}$ represented by the above general formula include: tetrafluoroborate $(BF_4)^-$; hexafluorophosphate $(PF_6)^-$, hexafluoroantimonate $(SbF_6)^-$, hexafluoroarsenate $(AsF_6)^-$, and hexachloroantimonate $(SbCl_6)^-$.

It is also possible to preferably use an anion $B^{m-}$ having a structure represented by:

$$[LX_{b-1}(OH)]^{m-}$$

"L", "X", and "b" are as defined above. Other anions that can be used include perchlorate ion $(ClO_4)^-$, trifluoromethylsulfite ion $(CF_3SO_3)^-$, fluorosulfonate ion $(FSO_3)^-$, toluene sulfonate anion, and trinitrobenzene sulfonate anion.

Among such onium salts, it is particularly advantageous to use, in the present invention, aromatic onium salts listed in the following (i) to (iii). Among these, a single type may be used alone, or two or more types may be used as a mixture. Preferable examples are as follows.

(i) Aryldiazonium salts, such as phenyldiazonium hexafluorophosphate, 4-methoxyphenyldiazonium hexafluoroantimonate, and 4-methylphenyldiazonium hexafluorophosphate.

(ii) Diaryliodonium salts, such as diphenyliodonium hexafluoroantimonate, di(4-methylphenyl)iodonium hexafluorophosphate, and di(4-tert-butylphenyl)iodonium hexafluorophosphate.

(iii) Triarylsulfonium salts, such as triphenylsulfonium hexafluoroantimonate, tris(4-methoxyphenyl)sulfonium hexafluorophosphate, diphenyl-4-thiophenoxyphenylsulfonium hexafluoroantimonate, diphenyl-4-thiophenoxyphenylsulfonium hexafluorophosphate, 4,4'-bis(diphenylsulfonio) phenyl sulfide-bis-hexafluoroantimonate, 4,4'-bis (diphenylsulfonio)phenyl sulfide-bis-hexafluorophosphate, 4,4'-bis[di(β-hydroxyethoxy)phenylsulfonio]phenyl sulfide-bis-hexafluoroantimonate, 4,4'-bis[di(β-hydroxyethoxy) phenylsulfonio]phenyl sulfide-bis-hexafluorophosphate, 4-[4'-(benzoyl)phenylthio]phenyl-di-(4-fluorophenyl)sulfonium hexafluoroantimonate, and 4-[4'-(benzoyl)phenylthio] phenyl-di-(4-fluorophenyl)sulfonium hexafluorophosphate.

Other preferable examples include: iron-arene complexes such as ($\eta^5$-2,4-cyclopentadiene-1-yl)[(1,2,3,4,5,6,-$\eta$)-(1-methylethyl)benzene] iron hexafluorophosphate; and mixtures of an aluminum complex such as tris(acetylacetonato) aluminum, tris(ethylacetonatoacetato)aluminum, and tris (salicylaldehydato)aluminum, and a silanol such as triphenylsilanol.

Among these compounds, aromatic iodonium salts, aromatic sulfonium salts, and iron-arene complexes are preferably used from the viewpoint of practicability and photosensitivity.

These photoinitiators may be used in combination with one type, or two or more types, of known photo-polymerization accelerators, such as benzoic-acid-based accelerators or tertiary-amine-based accelerators.

Known light sources, such as high-pressure mercury-vapor lamps, metal halide lamps, and xenon lamps, may be used as the light source for polymerization in cases where photoinitiators are used. Irradiation of active energy rays, such as ultraviolet rays, electron beams, X-rays, radial rays, and high frequency rays, causes a Lewis acid to be released from the photoinitiator, and thus the epoxy compound is cured. Light sources with a wavelength of 400 nm or below are effective as the above light sources.

Among these curing agents of the component (C), the curing agent to be used can be selected as appropriate. Latent curing agents are particularly preferable, and imidazole compounds are preferred in particular.

From the viewpoint of the properties of the cured product, the content of the epoxy resin curing agent of the component (C) with respect to the epoxy resin curable composition for a prepreg according to this invention is preferably 0.01% to 20% by mass, and more preferably 0.1% to 5%) by mass. Two or more types of the above curing agents may be used as a mixture.

Next, the filler, which is the component (D) of the present invention, is described.

Conventionally-known fillers may be used as the filler of the component (D) without particular limitation. It is, however, preferable to use fibrous fillers, such as glass fiber, aluminum borate whisker, boron nitride whisker, potassium titanate whisker, and titanium oxide whisker; or spherical fillers, such as silica, molten silica, and alumina. Particularly, spherical silica or spherical molten silica is preferable from the viewpoint of the properties (low linear thermal expansion coefficient) of the cured product. Needless to say, it is possible to use, for example, silica (molten silica, crystalline silica), alumina, aluminum borate, aluminum nitride, silicon nitride, boron nitride, potassium titanate, or titanium oxide, taking forms other than the fibrous or spherical form. Examples of other fillers include: talc, mica, calcium carbonate, glass flakes, glass beads, glass balloons, calcium silicate, aluminum hydroxide, barium sulfate, magnesia, ferrite, various metal particulates, graphite, and carbon; inorganic fibers, such as carbon fiber, boron fiber, silicon carbide fiber, alumina fiber, and silica alumina fiber; and organic fibers, such as aramid fiber, polyester fiber, cellulose fiber, and carbon fiber.

As regards fibrous fillers, it is preferable to choose, as appropriate, the length thereof in the long-axis direction and the aspect ratio depending on how they are used. As regards spherical fillers, truly spherical fillers having a small particle diameter are preferable, and particularly, fillers having an average particle diameter ranging from 0.1 to 20 μm are preferable.

From the viewpoint of the properties of the cured product, the content of the filler of the component (D) with respect to the epoxy resin curable composition for a prepreg according to this invention is preferably 0.1% to 97% by mass, and more preferably 1% to 95% by mass.

Next, the solvent, which is the component (E) of the present invention, is described.

Examples of the solvents of the component (E) include: γ-butyrolactones; amide-based solvents, such as N-methylpyixolidone (NMP), N,N-dimethylformamide (DMF), N,N-dimethylacetamide, and N,N-dimethyl imidazolidinone; sulfones such as tetramethylenesulfone; ether-based solvents, such as diethylene glycol dimethyl ether, diethylene glycol diethyl ether, propylene glycol, propylene glycol monomethyl ether, propylene glycol monomethyl ether monoacetate, and propylene glycol monobutyl ether; ketone-based solvents, such as methylethyl ketone, methylisobutyl ketone, cyclopentanone, and cyclohexanone; and aromatic solvents such as toluene and xylene. Among these compounds, ether-based solvents, such as diethylene glycol dimethyl ether, diethylene glycol diethyl ether, propylene glycol, propylene glycol monomethyl ether, propylene glycol monomethyl ether monoacetate, and propylene glycol monobutyl ether, are preferable from the viewpoint of solubility and dryability.

The content of the solvent of the component (E) with respect to the epoxy resin curable composition for a prepreg according to this invention is preferably 0.01% to 80% by mass, and more preferably 10% to 70% by mass.

In addition to the components (A) to (E), the epoxy resin composition for a prepreg of the present invention may include any other components as necessary.

Examples of such other components include: plasticizers such as natural waxes, synthetic waxes, and metal salts of long-chain fatty acids; mold-release agents such as acid amides, esters, and paraffins; stress relievers such as nitrile rubber and butadiene rubber; inorganic fire retardants such as antimony trioxide, antimony pentoxide, tin oxide, tin hydroxide, molybdenum, oxide, zinc borate, barium metaborate, red phosphorus, aluminum hydroxide, magnesium hydroxide, and calcium aluminate; bromine-based fire retardants such as tetrabromobisphenol A, tetrabromophthalic anhydride, hexabromobenzene, and brominated phenol novolac; phosphoric ester-based fire retardants; phosphoric acid amide-based fire retardants; coupling agents such as silane-based coupling agents, titanate-based coupling agents, and aluminum-based coupling agents; coloring agents such as dyes and pigments; oxidation stabilizers; light stabilizers; moisture-resistance improvers; thixotropes; diluents; antifoaming agents; various other resins; tackifiers; antistatic agents; slip additives; and UV absorbers.

Next, base materials to be employed for making a prepreg using the epoxy resin curable composition for a prepreg of the present invention are described.

Conventionally-used base materials can be used for the prepreg base material. Examples thereof include woven fabrics and nonwoven fabrics made, for example, of glass fiber, wholly aromatic polyester fiber, phenolic resin fiber, aramid fiber, polyimide fiber, carbon fiber, or polybenzazole (PBZ) fiber. Woven fabrics and nonwoven fabrics made of aramid fiber and woven fabrics and nonwoven fabrics made of polybenzazole fiber are preferable because of the low linear thermal expansion coefficient of the obtained prepreg.

A prepreg can be manufactured according to the ordinary method of applying the epoxy resin curable composition for a prepreg according to the present invention to a base material to impregnate the base material with the composition and heating the base material. Further, a coppered laminate can be obtained by laminating a plurality of sheets of these prepregs, placing a copper leaf on one side or both sides of the laminated structure, and heating and pressurizing the laminated structure under normal conditions. A laminate can be obtained if no copper leaf is used. Further, a multilayer plate can be manufactured according to the ordinary method of forming a circuit on the coppered laminate (inner layer plate), etching the copper leaf, placing a prepreg and a copper leaf on at least one side of the inner layer plate, and heating and pressurizing the laminate, for example, at 170° C. under a pressure of 40 kg/cm$^2$ for 90 minutes. Furthermore, printed wiring boards can be manufactured according to the ordinary method of forming through-holes in the coppered laminate or the multilayer plate, plating the through-holes, and forming a prescribed circuit.

WORKING EXAMPLES

The present invention is described in detail using working examples. The present invention, however, is not limited in any way by the following examples.

Synthesis Example 1

Synthesis of Polyamide Compound of Component (A) Using Above-described Structure No. 1

A solution was made by dissolving 16.48 g (0.045 mol) of 2,2-bis(3-amino-4-hydroxyphenyl)hexafluoropropane into a mixture of 40 g of N-methyl pyrrolidone (NMP) and 15.33 g of pyridine. A solution having 10.05 g (0.0495 mol) of isophthaloyl chloride dissolved into 40 g of NMP was dropped into the above solution at −15 to 0° C. The mixture was left to react for 2 hours while being kept at −15 to 0° C., and for another 2 hours at room temperature. After reprecipitation with approximately 2 liters of ion-exchange water, the solution was filtered, and the precipitate was dried at reduced pressure at 150° C. for 3 hours, to obtain 17.9 g of white powder ("working polymer 1" below) (80.1% yield).

Formation of an amide bond in the obtained white-powder compound was confirmed using infrared absorption spectra. The compound was confirmed to be a polymer having a weight-average molecular weight of 20,000 through, gel permeation chromatography. Also, analysis showed that the viscosity was 50 cps (25° C.; 30% by weight NMP solution) and that the OH equivalent was 250 g/eq.

Working Polymer I

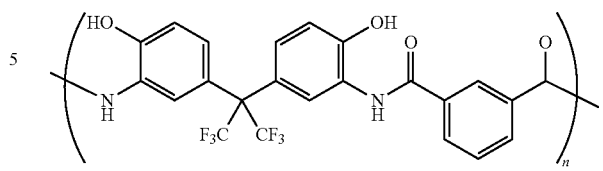

Viscosity: 50 cps (25° C.; 30wt% NMP solution)
Weight-average molecular weight: 20000
OH equivalent: 250 g/eq Synthesis Examples 2 to 20

The following working polymers 2 to 20 were synthesized in the same way as synthesis example 1. The weight-average molecular weight, the viscosity, and the OH equivalent of each of the obtained working polymers are shown below.

Working Polymer 2

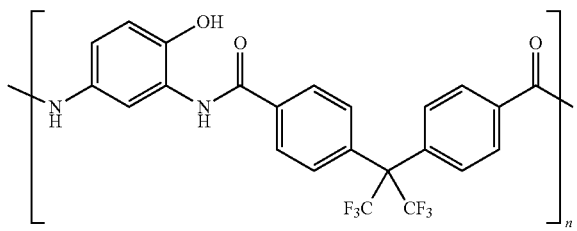

Viscosity: 50 cps (25° C.; 30 wt % NMP solution)
Weight-average molecular weight: 20000
OH equivalent: 484 g/eq Working Polymer 3

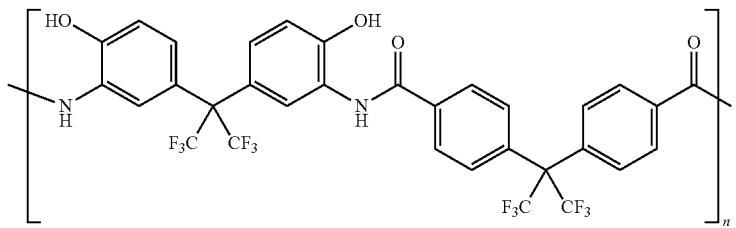

Viscosity: 50 cps (25° C.; 30 wt % NMP solution)
Weight-average molecular weight: 20000
OH equivalent: 363 g/eq Working Polymer 4

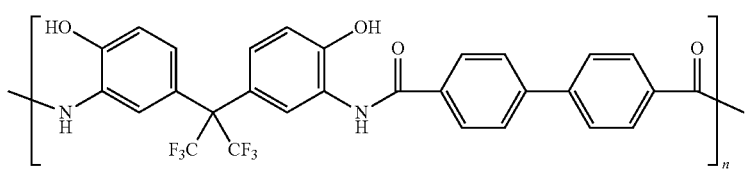

Viscosity: 150 cps (25° C.; 30 wt % NMP solution)
Weight-average molecular weight: 20000
OH equivalent: 288 g/eq Working Polymer 5

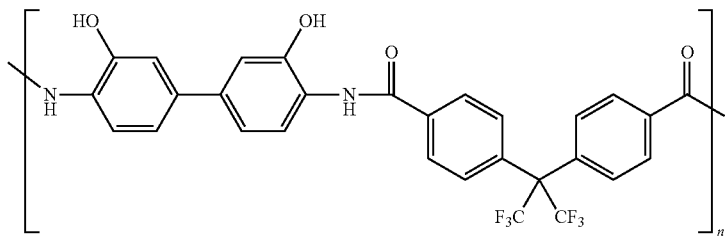

Viscosity: 200 cps (25° C.; 30 wt % NMP solution)
Weight-average molecular weight: 20000
OH equivalent: 288 g/eq Working Polymer 6

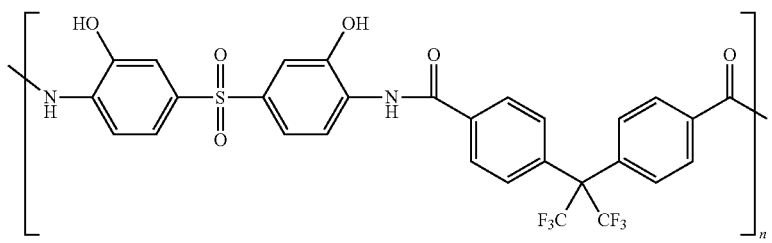

Viscosity: 200 cps (25° C.; 30 wt % NMP solution)
Weight-average molecular weight: 20000
OH equivalent: 320 g/eq Working Polymer 7

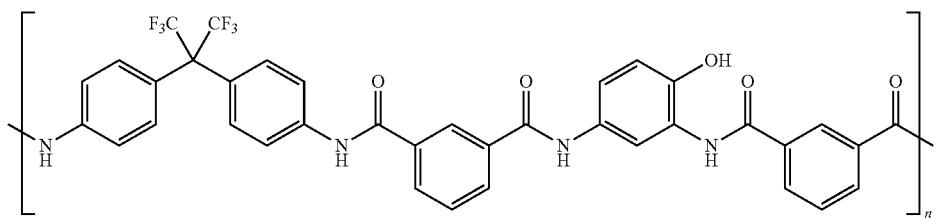

Viscosity: 150 cps (25° C.; 30 wt % NMP solution)
Weight-average molecular weight: 24000
OH equivalent: 722 g/eq Working Polymer 8

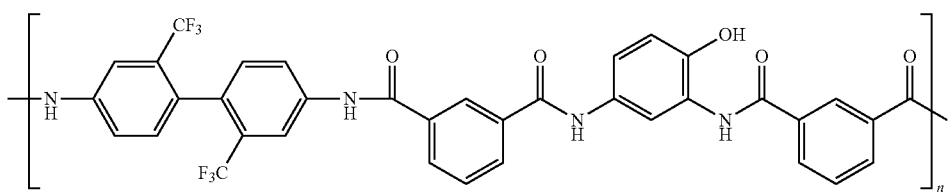

Viscosity: 150 cps (25° C.; 30 wt % NMP solution)
Weight-average molecular weight: 15000
OH equivalent: 708 g/eq Working Polymer 9

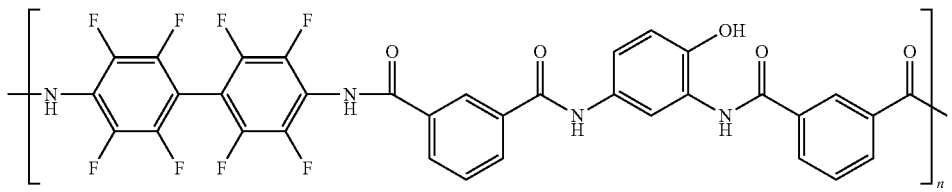

Viscosity: 150 cps (25° C.; 30 wt % NMP solution)
Weight-average molecular weight: 15000
OH equivalent: 716 g/eq Working Polymer 10

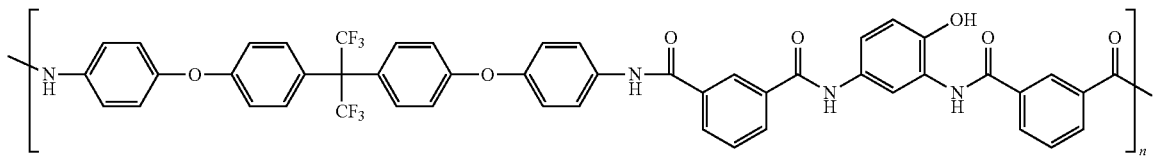

Viscosity: 150 cps (25° C.; 30 wt % NMP solution)
Weight-average molecular weight: 15000
OH equivalent: 906 g/eq Working Polymer 11

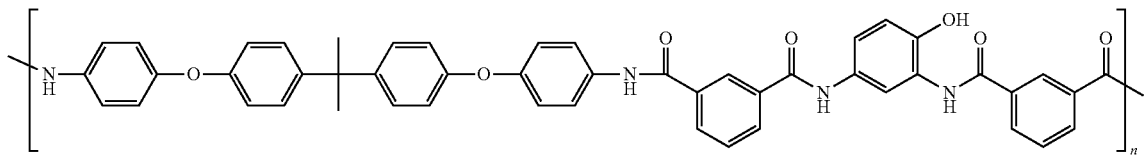

Viscosity: 200 cps (25° C.; 30 wt % NMP solution)
Weight-average molecular weight: 15000
OH equivalent: 798 g/eq Working Polymer 12

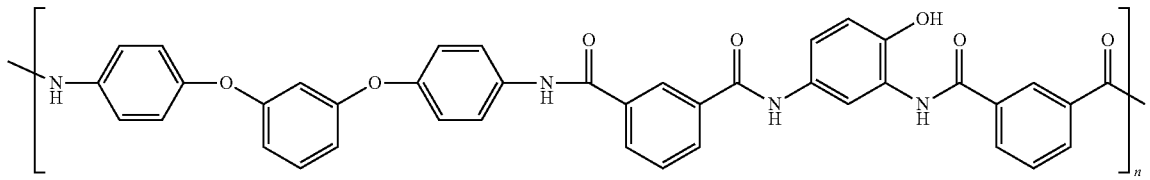

Viscosity: 200 cps (25° C.; 30 wt % NMP solution)
Weight-average molecular weight: 15000
OH equivalent: 680 g/eq Working Polymer 13

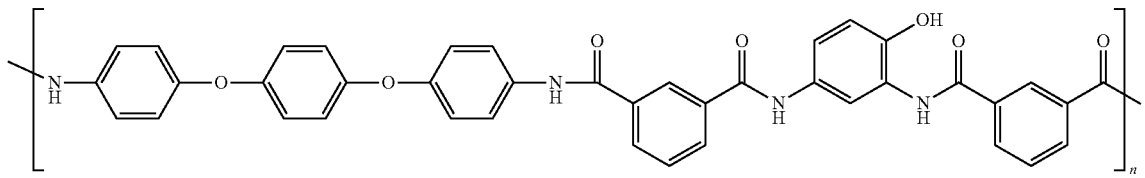

Viscosity: 200 cps (25° C.; 30 wt % NMP solution)
Weight-average molecular weight: 15000
OH equivalent: 680 g/eq Working Polymer 14

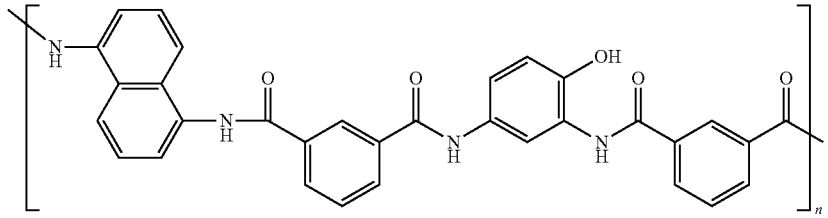

Viscosity: 250 cps (25° C.; 30 wt % NMP solution)
Weight-average molecular weight: 15000
OH equivalent: 546 g/eq -continued Working Polymer 15

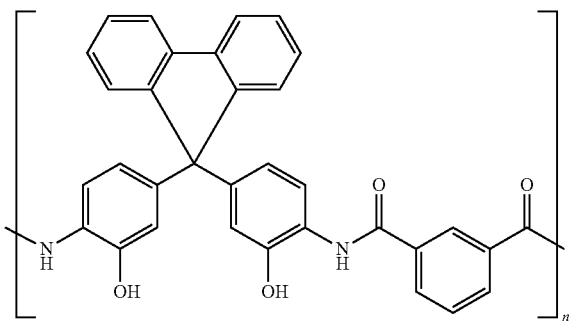

Viscosity: 100 cps (25° C.; 30 wt % NMP solution)
Weight-average molecular weight: 20000
OH equivalent: 257 g/eq Working Polymer 16

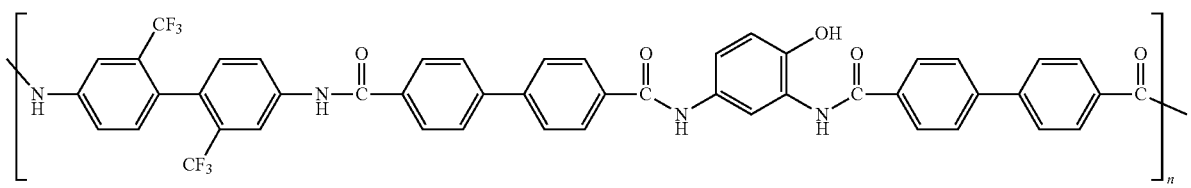

Viscosity: 100 cps (25° C.; 30 wt % NMP solution)
Weight-average molecular weight: 15000
OH equivalent: 860 g/eq Working Polymer 17

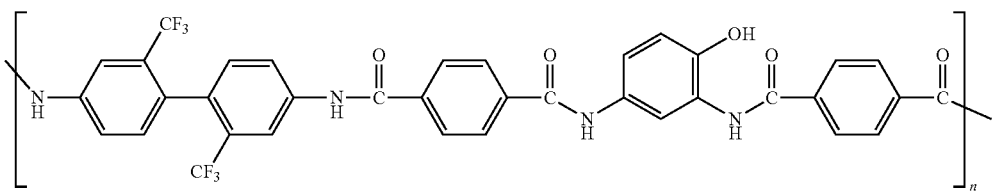

Viscosity: 100 cps (25° C.; 30 wt % NMP solution)
Weight-average molecular weight: 15000
OH equivalent: 708 g/eq Working Polymer 18

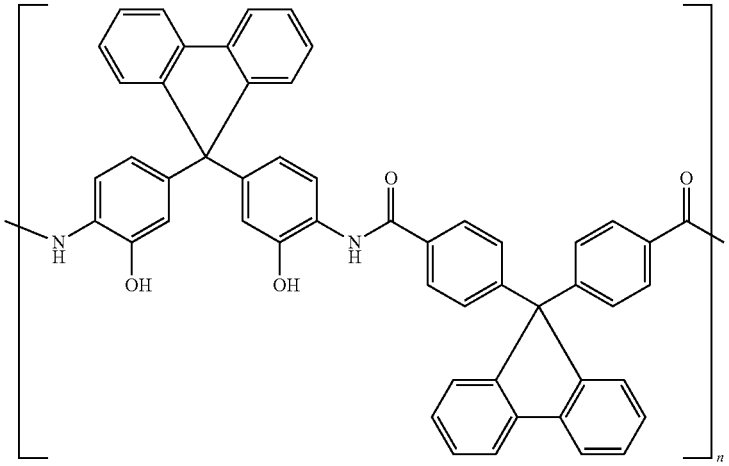

Viscosity: 100 cps (25° C.; 30 wt % NMP solution)
Weight-average molecular weight: 20000
OH equivalent: 377 g/eq

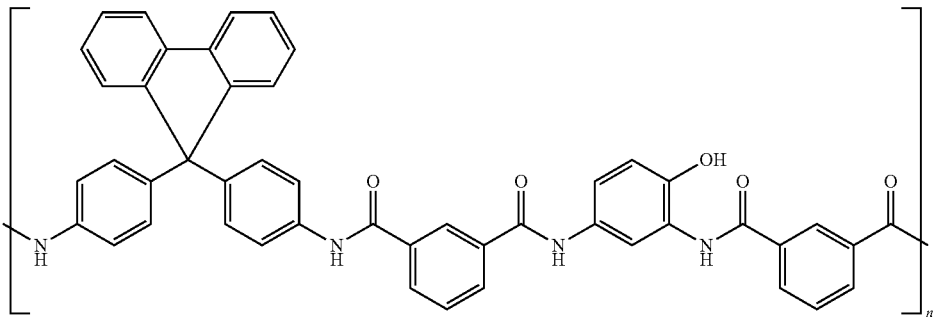

Working Polymer 19

Viscosity: 150 cps (25° C.; 30 wt % NMP solution)
Weight-average molecular weight: 20000
OH equivalent: 736 g/eq

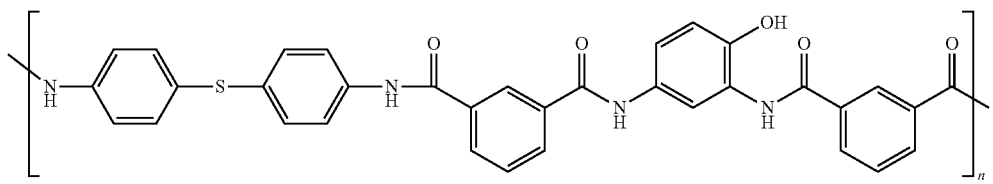

Working Polymer 20

Viscosity: 200 cps (25° C.; 30 wt % NMP solution)
Weight-average molecular weight: 15000
OH equivalent: 604 g/eq

Working Examples 1 to 24 and Comparative Examples 1 to 6

Epoxy resin curable compositions for prepregs were prepared according to the formulas shown in Tables 1 to 5 using the working polymers obtained by the above-described synthesis examples and comparative polymers described further below. Prepregs were made using those epoxy resin curable compositions and the base materials shown in Tables 1 to 5. Four pieces of those prepregs were laminated, a 5-μm copper leaf was attached to the surface of each laminate, and each laminate was pressed for 90 minutes in a vacuum at 180° C. under 50 kg/cm². The glass transition temperature and the linear thermal expansion coefficient of each prepared laminate were measured. The results are shown in Tables 1 to 5.

The glass transition temperature was measured by the dynamic viscoelastic method using a sample cut out as a rectangular slip 5 mm wide and 40 mm long.

The linear thermal expansion coefficient was measured with a TMA using a sample cut out as a rectangular slip 3 mm wide and 10 mm long.

TABLE 1

|  | Working Example 1 | Working Example 2 | Working Example 3 | Working Example 4 | Working Example 5 | Working Example 6 |
| --- | --- | --- | --- | --- | --- | --- |
| Working Polymer 1 | 10 g | 10 g | 10 g | 10 g | 10 g |  |
| Working Polymer 2 |  |  |  |  |  | 10 g |
| Epoxy Resin 1 *1 | 5.7 g | 10 g | 10 g | 10 g | 7.5 g | 3.0 g |
| Spherical Silica *2 | 2.2 g (6 vol %) | 2.8 g (6 vol %) | 2.8 g (6 vol %) | 13 g (24 vol %) | 12.1 g (24 vol %) | 8.6 g (24 vol %) |
| TiO₂ Whisker *3 | 0 | 0 | 0 | 0 | 7 g (10 vol. %) | 0 |
| Imidazole-based Curing Agent *4 | 0.08 g | 0.14 g | 0.14 g | 0.14 g | 0.11 g | 0.07 g |
| PGM *5 | 20 g | 20 g | 20 g | 20 g | 20 g | 20 g |
| Base Material | Aramid Nonwoven Fabric | Glass Cloth | Aramid Cloth | PBZ Nonwoven Fabric | PBZ Cloth | PBZ Cloth |
| Glass Transition Temperature | 270° C. | 270° C. | 270° C. | 270° C. | 270° C. | 212° C. |
| Linear Thermal Expansion Coefficient | 7 ppm | 18 ppm | 6 ppm | 5 ppm | 3 ppm | 4 ppm |

TABLE 2

|  | Working Example 7 | Working Example 8 | Working Example 9 | Working Example 10 | Working Example 11 | Working Example 12 |
|---|---|---|---|---|---|---|
| Working Polymer 3 | 10 g | | | | | |
| Working Polymer 4 | | 10 g | | | | |
| Working Polymer 5 | | | 10 g | | | |
| Working Polymer 6 | | | | 10 g | | |
| Working Polymer 7 | | | | | 10 g | |
| Working Polymer 8 | | | | | | 10 g |
| Epoxy Resin 1 *1 | 4.0 g | 5.0 g | 5.0 g | 4.5 g | 2.0 g | 2.0 g |
| Spherical Silica *2 | 9.3 g (24 vol. %) | 9.9 g (24 vol. %) | 9.9 g (24 vol. %) | 9.6 g (24 vol. %) | 7.9 g (24 vol. %) | 6.7 g (24 vol. %) |
| Imidazole-based Curing Agent *4 | 0.08 g | 0.08 g | 0.08 g | 0.08 g | 0.05 g | 0.05 g |
| PGM *5 | 20 g | 20 g | 20 g | 20 g | 20 g | 20 g |
| Base Material | PBZ Cloth | PBZ Cloth | PBZ Cloth | PBZ Cloth | PBZ Cloth | PBZ Cloth |
| Glass Transition Temperature | 280° C. | 230° C. | 225° C. | 205° C. | 215° C. | 230° C. |
| Linear Thermal Expansion Coefficient | 5 ppm | 5 ppm | 5 ppm | 4 ppm | 4 ppm | 4 ppm |

TABLE 3

|  | Working Example 13 | Working Example 14 | Working Example 15 | Working Example 16 | Working Example 17 | Working Example 18 |
|---|---|---|---|---|---|---|
| Working Polymer 9 | 10 g | | | | | |
| Working Polymer 10 | | 10 g | | | | |
| Working Polymer 11 | | | 10 g | | | |
| Working Polymer 12 | | | | 10 g | | |
| Working Polymer 13 | | | | | 10 g | |
| Working Polymer 14 | | | | | | 10 g |
| Epoxy Resin 1 *1 | 4.0 g | 1.6 g | 1.8 g | 2.1 g | 2.1 g | 2.6 g |
| Spherical Silica *2 | 9.3 g (24 vol %) | 7.7 g (24 vol %) | 7.8 g (24 vol %) | 8.0 g (24 vol %) | 8.0 g (24 vol %) | 8.3 g (24 vol %) |
| Imidazole-based Curing Agent *4 | 0.08 g | 0.05 g | 0.05 g | 0.05 g | 0.05 g | 0.06 g |
| PGM *5 | 20 g | 20 g | 20 g | 20 g | 20 g | 20 g |
| Base Material | PBZ Cloth | PBZ Cloth | PBZ Cloth | PBZ Cloth | PBZ Cloth | PBZ Cloth |
| Glass Transition Temperature | 170° C. | 200° C. | 170° C. | 175° C. | 185° C. | 200° C. |
| Linear Thermal Expansion Coefficient | 6 ppm | 3 ppm | 4 ppm | 3 ppm | 3 ppm | 3 ppm |

TABLE 4

|  | Working Example 19 | Working Example 20 | Working Example 21 | Working Example 22 | Working Example 23 | Working Example 24 |
|---|---|---|---|---|---|---|
| Working Polymer 15 | 10 g | | | | | |
| Working Polymer 16 | | 10 g | | | | |
| Working Polymer 17 | | | 10 g | | | |
| Working Polymer 18 | | | | 10 g | | |
| Working Polymer 19 | | | | | 10 g | |
| Working Polymer 20 | | | | | | 10 g |

TABLE 4-continued

|  | Working Example 19 | Working Example 20 | Working Example 21 | Working Example 22 | Working Example 23 | Working Example 24 |
|---|---|---|---|---|---|---|
| Epoxy Resin 1 *1 | 5.6 g | 1.7 g | 2.0 g | 3.8 g | 2.0 g | 2.4 g |
| Spherical Silica *2 | 10.3 g (24 vol %) | 7.7 g (24 vol %) | 7.9 g (24 vol %) | 9.1 g (24 vol %) | 6.7 g (24 vol %) | 6.7 g (24 vol %) |
| Imidazole-based Curing Agent *4 | 0.08 g | 0.05 g | 0.05 g | 0.08 g | 0.05 g | 0.06 g |
| PGM *5 | 20 g | 20 g | 20 g | 20 g | 20 g | 20 g |
| Base Material | PBZ Cloth | PBZ Cloth | PBZ Cloth | PBZ Cloth | PBZ Cloth | PBZ Cloth |
| Glass Transition Temperature | 235° C. | 190° C. | 185° C. | 240° C. | 230° C. | 175° C. |
| Linear Thermal Expansion Coefficient | 3 ppm | 3 ppm | 3 ppm | 3 ppm | 3 ppm | 3 ppm |

TABLE 5

|  | Comparative Example 1 | Comparative Example 2 | Comparative Example 3 | Comparative Example 4 | Comparative Example 5 | Comparative Example 6 |
|---|---|---|---|---|---|---|
| Comparative Polymer 1 *6 | 10 g | 10 g |  |  |  |  |
| Comparative Polymer 2 *7 |  |  | 10 g | 10 g |  |  |
| Epoxy Resin 1 *1 | 4.8 g | 4.8 g | 4.8 g | 4.8 g | 13.6 g | 13.6 g |
| Phenolic Resin 1 *8 |  |  |  |  | 10.5 g | 10.5 g |
| Spherical Silica *2 | 2.0 g (6 vol %) | 2.0 g (6 vol %) | 2.0 g (6 vol %) | 2.0 g (6 vol %) | 3.4 g (6 vol %) | 3.4 g (6 vol %) |
| Imidazole-based Curing Agent *4 | 0.143 g | 0.143 g | 0.18 g | 0.18 g | 0.14 g | 0.14 g |
| PGM *5 | 10 g | 10 g | 10 g | 10 g | 10 g | 10 g |
| Base Material | Glass Cloth | PBZ Cloth | Glass Cloth | PBZ Cloth | Glass Cloth | PBZ Cloth |
| Glass Transition Temperature | 165° C. | 165° C. | 170° C. | 170° C. | 150° C. | 150° C. |
| Linear Thermal Expansion Coefficient | 35 ppm | 20 ppm | 40 ppm | 22 ppm | 45 ppm | 30 ppm |

In Tables 1 to 5, "vol %" of spherical silica indicates the volume ratio of spherical silica with respect to the mixture. Further, "*1" to "*8" in Tables 1 to 5 are as follows.

*1: Epoxy resin 1

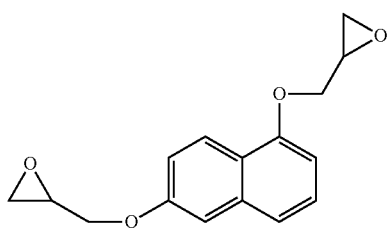

Epoxy equivalent: 136 g/eq

*2: Spherical silica:
Average particle diameter 0.1 to 20 μm
*3: Titanium dioxide whisker
*4: Imidazole-based curing agent:
2-phenyl-4,5-dihydroxymethylimidazole
*5: PGM:
Propylene glycol monomethyl ether
*6: Comparative Polymer 1

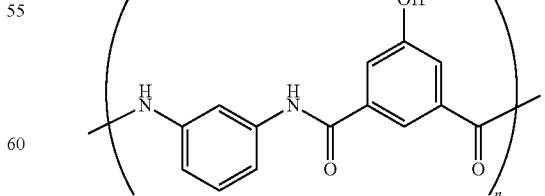

Viscosity: 150 cps (25° C.; 30wt% NMP solution)
Weight-average molecular weight: 1450
OH equivalent: 285 g/eq

*7: Comparative Polymer 2

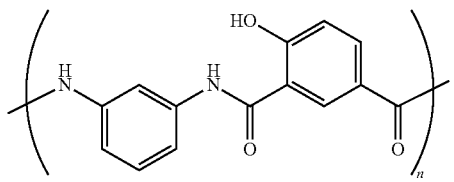

Viscosity:150 cps (25° C.;30wt% NMP solution)
Weight-average molecular weight: 1450
OH equivalent:285 g/eq

*8: Phenolic Resin 1

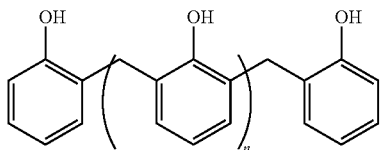

OH equivalent: 105 g/eq

INDUSTRIAL APPLICABILITY

According to the present invention, it is possible to provide a prepreg having a high, glass transition temperature and low linear thermal expansion coefficient.

The invention claimed is:

1. An epoxy resin curable composition for a prepreg, comprising the following components (A) to (E):
   (A): 1 to 90% by mass of a polyamide compound represented by the following formula:

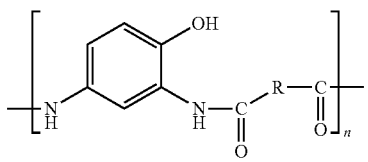

wherein: R represents an alkylene group having 2 to 10 carbon atoms, a cycloalkylene having 6 to 18 carbon atoms, an arylene group, or an alkylidene-diarylene group having 13 to 25 carbon atoms; said alkylene, cycloalkylene, arylene, or alkylidene-diarylene groups are optionally substituted by a halogen atom, a hydroxyl group, or an alkyl group having 1 to 4 carbon atoms; and n is a positive number;
   (B): 1 to 50% by mass of an epoxy resin;
   (C): 0.1 to 5% by mass of an imidazole compound as an epoxy resin curing agent;
   (D): 1 to 95% by mass of spherical silica or spherical molten silica having an average particle diameter ranging from 0.1 to 20 μm; and
   (E): 10 to 70% by mass of a solvent.

2. A prepreg comprising a base material impregnated with the epoxy resin curable composition for a prepreg according to claim 1.

3. A printed wiring board comprising a cured prepreg, wherein the prepreg is the prepreg according to claim 2.

* * * * *